(12) United States Patent
Löbl et al.

(10) Patent No.: US 6,522,223 B1
(45) Date of Patent: Feb. 18, 2003

(54) ZERO-IF-CONVERTER WITH RC FILTERS

(75) Inventors: Hans Peter Löbl, Monschau (DE);
Paul H. M. Van Oppen, Roemond (NL); Theodoor G. S. M. Rijks, Eindoven (NL); Mareike K. Klee, Hückelhoven-Randerath (DE); Gerardus J. N. Doodeman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/481,143

(22) Filed: Jan. 12, 2000

(30) Foreign Application Priority Data

Jan. 25, 1999 (DE) .......................... 199 02 865

(51) Int. Cl.[7] .................................. H03H 1/02
(52) U.S. Cl. ..................... 333/172; 361/275.3
(58) Field of Search ................ 33/172; 361/275.3

(56) References Cited

U.S. PATENT DOCUMENTS

| | | | | |
|---|---|---|---|---|
| 3,569,872 A | * | 3/1971 | Berlin | ........................ 333/172 |
| 3,949,275 A | * | 4/1976 | Muenz | .................... 333/172 X |
| 5,495,387 A | * | 2/1996 | Mandai et al. | .......... 333/172 X |
| 5,629,655 A | | 5/1997 | Dent | ........................... 333/172 |
| 5,889,445 A | * | 3/1999 | Ritter et al. | ................. 333/172 |

OTHER PUBLICATIONS

"Low–IF Topologies for High–Performance Analog Front Ends of Fully Integrated Receivers" by Jan Crols at al., in IEEE Transactions on Circuits and Systems–II Analog and Digital Signal Processing, vol. 43, No. 3 Mar. 1998, pp. 269–282.

* cited by examiner

Primary Examiner—Justin P. Bettendorf
(74) Attorney, Agent, or Firm—Aaron Waxler (57) ABSTRACT

A zero-IF-converter, particularly for digital satellite receivers, comprising a thin-film component including at least two RC filters each including a resistor and a capacitor which each comprise a lower electrode, an upper electrode and a dielectric material, said RC filters being arranged on a common substrate, is characterized by a constant amplitude and phase relationship between the base band signals I and Q.

7 Claims, 9 Drawing Sheets

ZERO-IF-CONVERTER WITH RC FILTERS

BACKGROUND OF THE INVENTION

The invention relates to a zero-IF-converter comprising a thin-film component including at least two RC filters each comprising a resistor and a capacitor which each include a lower electrode, an upper electrode and a dielectric material.

At present, filters in zero-IF-converters for digital satellite receivers are symmetrically built up of individual capacitors and coils for the two signals of the baseband I and Q. A drawback of this construction resides in that the use of low-priced components causes the accuracy of the coils and capacitors to be reduced to a low level. As a result, the phase relationship between the signals of the baseband I and Q becomes difficult to reproduce. Consequently, expensive coils and capacitors with small tolerances must be used. In addition, the temperature dependence of the components leads to a change in the phase relationship between I and Q when the temperature drift of the components is different in both signal branches. Additionally, the manufacture, in a conventional manner, of a filter comprising discrete coils and capacitors or resistors and capacitors leads to very large dimensions.

U.S. Pat No. 5,629,655 discloses a stepwise-adjustable notch frequency filter comprising at least one input terminal and at least one output terminal and a ground terminal, a first number of resistive elements constructed as thin films deposited over a corresponding number of conducting plates with intervening dielectric layers, said resistive elements being connected in series between said at least one input and said at least one output terminal, and a second number of switches selectively arranged so as to be able to connect together certain of said conducting plates to form a resistance which is connected to said ground terminal, and means to change the value of said resistance depending on which of said conducting plates are connected together to form said resistance. The problems encountered in the mass-manufacture of said filters should be mastered by means of this arrangement.

SUMMARY OF THE INVENTION

It is an object of the invention to provide a zero-IF-converter of high quality, wherein the phase and amplitude relationship between two or more signals is very stable.

In accordance with the invention, this object is achieved by a zero-IF-converter comprising a thin-film component including at least two RC filters each comprising a resistor and a capacitor which each include a lower electrode, an upper electrode and a dielectric material, said RC filters being arranged on a common substrate. Such a zero-IF-converter is characterized by small tolerances, small dimensions and a constant amplitude and phase relationship between the base signals I and Q.

Within the scope of the invention, it is preferred that at least one RC filter is a distributed RC filter.

At least one RC filter may also be a discrete RC filter.

The upper electrode of the distributed RC filter may be resistive.

Preferably, the lower electrode of the distributed RC filter is resistive.

It may alternatively be preferred that at least one RC filter is a RC notch filter having a notch resistor.

Within the scope of the invention it is particularly preferred that at least one RC filter is a distributed RC filter, and the notch resistor is a distributed resistance component. This embodiment is characterized by a simple construction, a very good frequency characteristic and very good stability with respect to process variations.

It may be further preferred that the substrate is made of a heat-conducting material. By manufacturing the RC filters on a heat-conducting material such as $Al_2O_3$, it is ensured that the effect of temperature on the RC filters is identical.

The invention also relates to a thin-film component comprising at least two RC filters each having a resistor and a capacitor which each comprise a lower electrode, an upper electrode and a dielectric material, said RC filters being arranged on a common substrate.

DETAILED DESCRIPTION OF THE PREFERRED EMBODIMENTS

A zero-IF-converter in accordance with the invention comprises a thin-film component including at least two RC filters each having a resistor and a capacitor which each comprise an upper electrode 1, a dielectric material 2 and a lower electrode 3, which are arranged on a common substrate.

The resistors and the capacitors, which are the component parts of the RC filters, and the notch resistor may be embodied so as to be either discrete or distributed components.

The thin-film component may for example be constructed so that the RC notch-filters comprise a distributed, resistive upper electrode and a distributed, resistive lower electrode.

The thin-film component may alternatively be constructed so that the RC notch-filters comprise a distributed, resistive upper electrode and a highly conducting lower electrode. In this case, the notch resistor between the lower electrode and mass is embodied so as to be a discrete thin-film resistor integrated on the substrate.

In a further embodiment, the thin-film component may be constructed so that the RC notch-filters comprise a distributed, resistive lower electrode and a highly conducting upper electrode. In this case, the notch resistor between the upper electrode and mass is embodied so as to be a discrete thin-film resistor integrated on the substrate.

The thin-film component may alternatively be constructed so that the RC notch-filters comprise discrete thin-film resistors and thin-film capacitors integrated on a substrate.

In general, a filter is provided for each one of the two baseband signals I and Q, and both filters are symmetrically mounted on the common substrate. The distributed RC filters exhibit the same transmission behavior as a low-pass filter. Distributed RC notch-filters exhibit the same transmission behavior as a low-pass filter but additionally demonstrate a strong attenuation at a certain frequency ("notch").

The thin-film component can be manufactured by means of known thin-film and photolithographic techniques. The use of thin-film techniques to manufacture these distributed RC filters enables very small tolerances of the filter to be achieved. By manufacturing both filters on a highly heat-conducting substrate, such as $Al_2O_3$, it is additionally achieved that the effect of temperature on both filters is identical and that the phase and amplitude relationship between I and Q is maintained. In the method in accordance with the invention, the application of the-film technique and the manufacture of capacitors and resistors on a substrate results in a very small RC filter as compared to a conventionally constructed filter.

As the material for the common substrate use is made of substrates which may preferably consist of a heat-conducting material, such as aluminum oxide with and without planarization layers (for example glass), glass or silicon.

It is also possible to arrange active components, such as diodes or other active circuits, on the common substrate. The diodes are used, for example, as an ESD protection of the RC filter.

Depending on the embodiment of the invention, the upper electrode and the lower electrode may consist of a highly heat-conducting material or a resistance material. Preferably, materials having a small temperature dependence of the specific resistance are used as the resistance material. For the resistance materials having a very small temperature dependence use can be made of $Ni_xCr_y$ (0<x<1, 0<y<1), $Ni_xCr_yAl_z$ (0<x<1, 0<y<1, 0<z<1), $Cu_xNi_y$ (0<x<1, 0<y<1), $Ta_xN_y$ (0<x<1, 0<y<1), $Ti_xW_y$ (0<x<1, 0<y<1), $Ti_xW_yN_z$ (0<x<1, 0<y<1, 0<z<1), $Cr_xSi_yO_z$ (0<x<1, 0<y<1, 0<z<1), $Cr_xSi_yN_z$ (0<x<1, 0<y<1, 0<z<1).

It is alternatively possible to use resistance materials having a greater temperature dependence of the specific resistance, which, e.g. like polysilicon, are characterized by compatibility with IC processes. The temperature dependence of the resistance material can be counteracted for these embodiments by an opposite temperature dependence of the capacitor material selected for this purpose.

For the capacitor material use can be made of $Si_xN_y$ (0<x<1, 0<y<1), $Si_xO_y$ (0<x<1, 0<y<1), $Si_xO_yN_zH_w$ (0<x<1, 0<y<1, 0<z<1, 0<w<1), $Al_xO_y$ (0<x<1, 0<y<1), $Ti_xO_y$ (0<x<1, 0<y<1), $Ta_xO_y$ (0<x<1, 0<y<1), $Ba^{1-x}Sr_xTiO_3$ with 0<x<1, $SrZr_xTi_{1-x}O_3$ with 0<x<1 with or without Mn-doping, $BaO—Ln_2O_3—TiO_2$ with Ln=La, Ce, Nd, Sm, Eu, $MgO—TiO_2—CaO—Al_2O_3—SiO_2$ doped with Nb, Y, La, Pr, Ni; $Ba_2Ti_9O_{20}$, $Ba_2Ti_{9-x}Zr_xO_{20}$ with 0<x<1, doped with Mn; $BaTi_5O_{11}$, $BaTi_4O_9$, $Nb_2O_5$, mixed oxides of $(Ta_2O_5)_x$ and $(Al_2O_3)_{1-x}$ or $Ta_2O_5)_x$ and $(TiO_2)_{1-x}$ or $(Ta_2O_5)_x$ and $(Nb_2O_5)_{1-x}$, or $(Ta_2O_5)_x$ and $(SiO_2)_{1-x}$; (Sr, Ca)(Ti, Zr)O_3$; $BaO—CaO—Nd_2O_3—Gd_2O_3—Nb_2O_5—TiO_2$; $CaSm_2Ti_5O_{14}$; $Zr(Ti, Sn)O_4$; $BaO—PbO—Nd_2O_3—Pr_2O_3—Bi_2O_3—TiO_2$; $Ba(Zr,Zn,Ta)O_3$; mixed oxides of $CaTiO_3$ and $LaAlO_3$; $(Bi_3(Ni_2Nb)O_9)_{1-x}((Bi_2(ZnNb_2(1+d))_yO_{3+6y+5yd})_x$ with 0<x<1, 0.5<y<1.5 and −0.05<d<+0.05; $PbZr_xTi_{1-x}O_3$ with 0<x<1 with and without an excess of lead; $Pb_{1-ay}La_yZr_xTi_{1-x}O_3$ with 0<y<0.20, 1.3<α<1.5; 0<x<1, $Pb_{1-ay}La_yTiO_3$ with 0<y<0.3, 1.3<α<1.5; (Pb,Ca)TiO_3$, $BaTiO_3$ doped with Nb and Co, $BaZr_xTi_{1-x}O_3$ with 0<x<1, $Ba_{1-y}Sr_yZr_xTi_{1-x}O_3$ with 0<x<1, 0<y<1, $Ba_{1-x}Sr_xTiO_3$ with 0<x<1, $SrTiO_3$ doped with La, Nb, Fe, Mn, $(BaTiO_3)_x+(Nd_2O_3)_y+(TiO_2)_z$ with 0.1<x<0.3, 0.2<y<0.4, 0.2<z<0.4, $CaZrO_3$, $(Sr,Ca)(Ti,Zr)O_3$, $(Sr,Ca,M)(Ti,Zr)O_3$ with M=Mg or Zn; $BaO—TiO_2—Nd_2O_3—Nb_2O_5$, $BaO—PbO—Nd_2O_3—TiO_2$; $Ba(Zn,Ta)O_3$, $BaZrO_3$, $PbNb_x((Zr_{0.6}Sn_{0.4})_{1-y}Ti_y))_{1-x}O_3$, $Pb(Mg_{1/3}Nb_{2/3})O_3]_x—[PbTiO_3]_{1-x}$ 0<x<1, $(Pb,Ba,Sr)(Mg_{1/3}Nb_{2/3})_xTi_y(Zn_{1/3}Nb_{2/3})_{1-x-y}O_3$ with 0<x<1, 0<y<1, lead-containing Perowskite such as $Pb(Mg_{0.5}W_{0.5})O_3$, $Pb(Fe_{1/2}Nb_{1/2})O_3$, $Pb(Fe_{2/3}3W_{1/3})O_3$, $Pb(Mg_{1/2}W_{1/2})O_3$, $Pb(Ni_{1/3}Nb_{2/3})O_3$, $Pb(Zn_{1/3}Nb_{2/3})O_3$, $Pb(Sc_{1/2}Ta_{1/2})O_3$, as well as combinations of these lead-containing Perowskites with $PbTiO_3$ and $Pb(Mg_{1/3}Nb_{2/3})O_3$ with or without an excess of lead.

EXAMPLE 1

Figure 1:
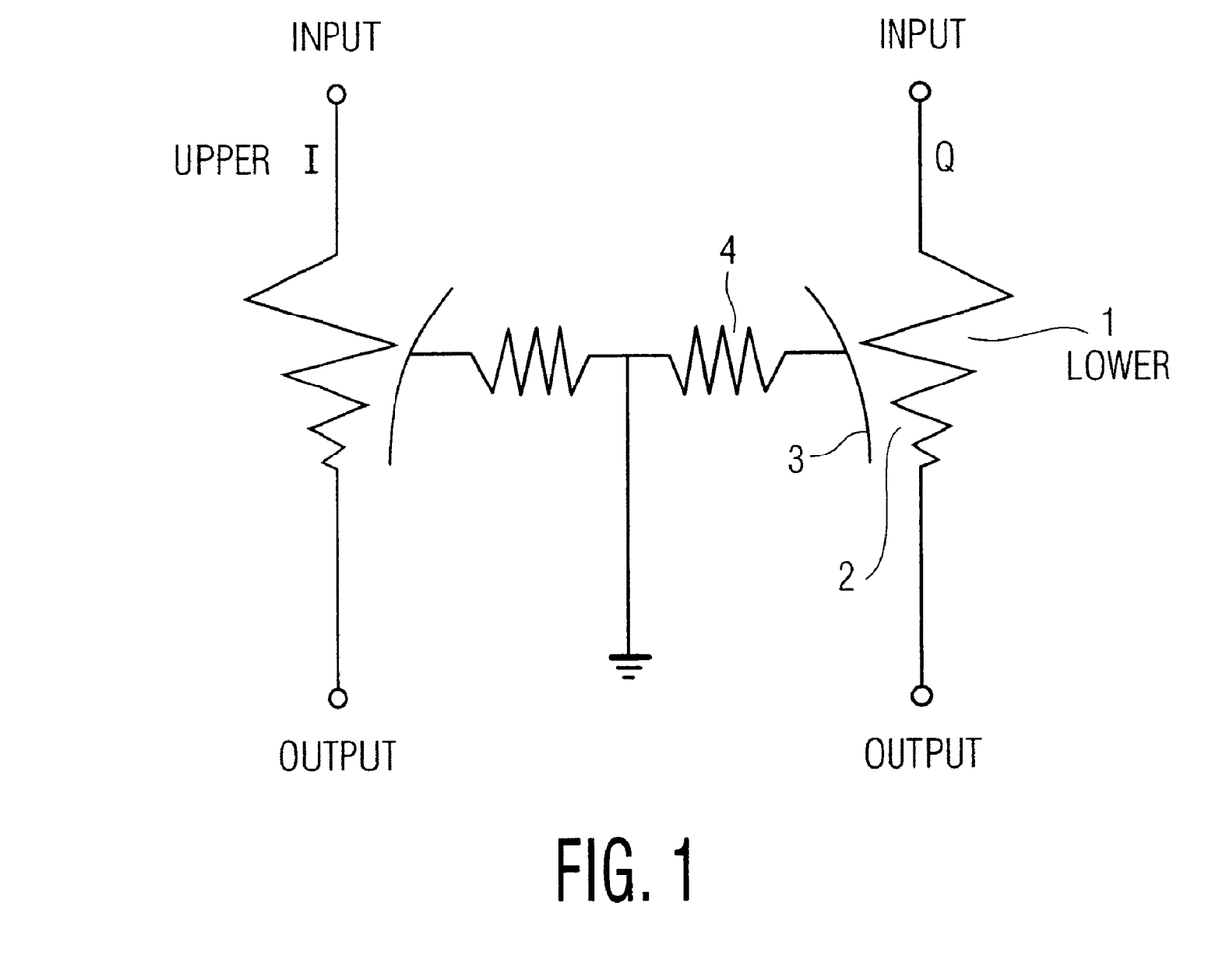
FIG. 1 shows the basic circuit of a thin-film component in accordance with a first embodiment, having two RC notch-filters with a discrete notch resistor.

This embodiment relates to a thin-film component comprising two distributed RC notch-filters with a discrete notch resistor on an $Al_2O_3$ substrate having a size of 1210 (3.0 mm×2.4 mm) in accordance with the basic circuit shown in FIG. 1. The distributed upper electrode forms the input or the output of the filter. The lower electrode is connected to ground via a notch resistor R.

Figure 2:
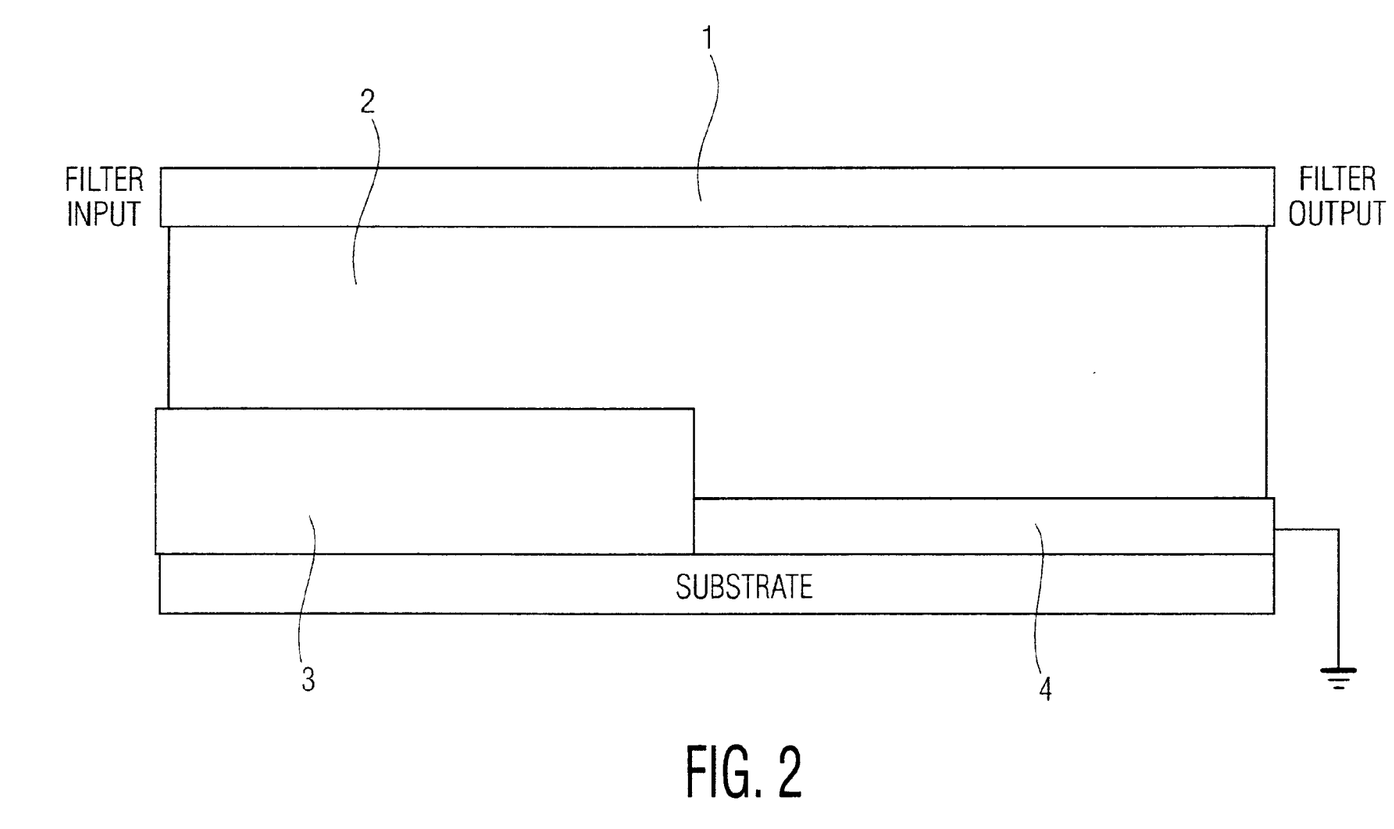
FIG. 2 is a cross-sectional view of a thin-film component in accordance with FIG. 1.
Figure 3:
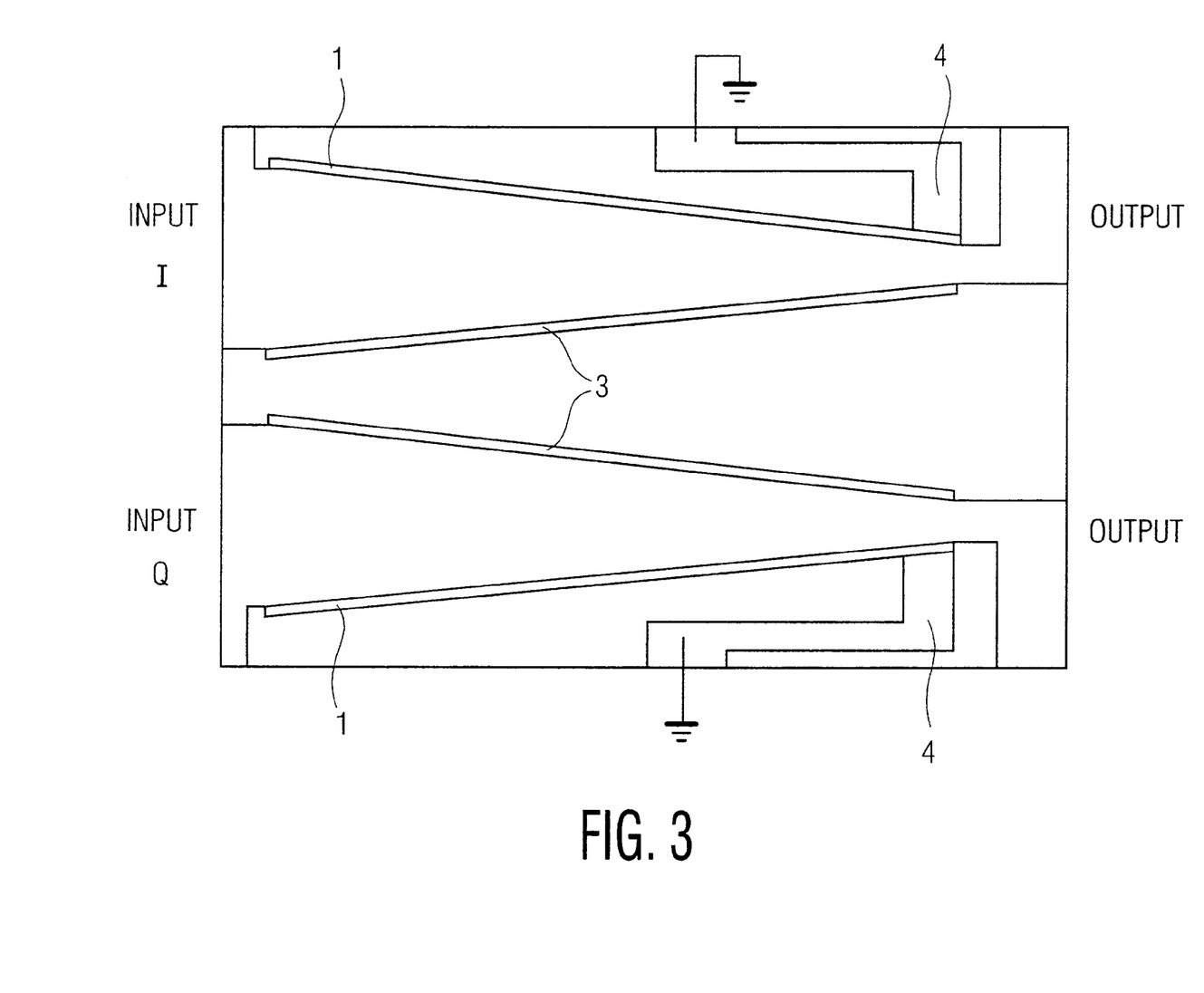
FIG. 3 is a plan view of a thin-film component in accordance with FIG. 1.

The construction of the thin-film component is shown in FIG. 2 and FIG. 3. A dielectric layer 2 having a thickness of 1.1 μm and 55 pF/mm$^2$ is deposited on a structured lower electrode 3 of Al having a thickness of approximately 0.5–3 μm. An upper electrode 1 which serves as a distributed resistance layer of NiCrAl having a surface resistance of approximately 100 Ω/□ is provided thereon. A discrete notch-resistor 4 of NiCrAl having a resistance of 15.8 Ω is connected to the lower electrode. During operation of the filter, this resistor is electrically connected to ground. The input and the output of the filter are situated at the upper electrode.

In another embodiment, the lower electrode 3 and the upper electrode 1 are exchanged. In this case, the discrete resistor 4 is connected to the upper electrode 1 and subsequently to ground.

The thin-film component is protected against moisture by means of a protective layer of $Si_3Ni_4$ or polyimide, and provided with standard SMD end contacts of Cu/Ni/Sn.

EXAMPLE 2

Figure 4:
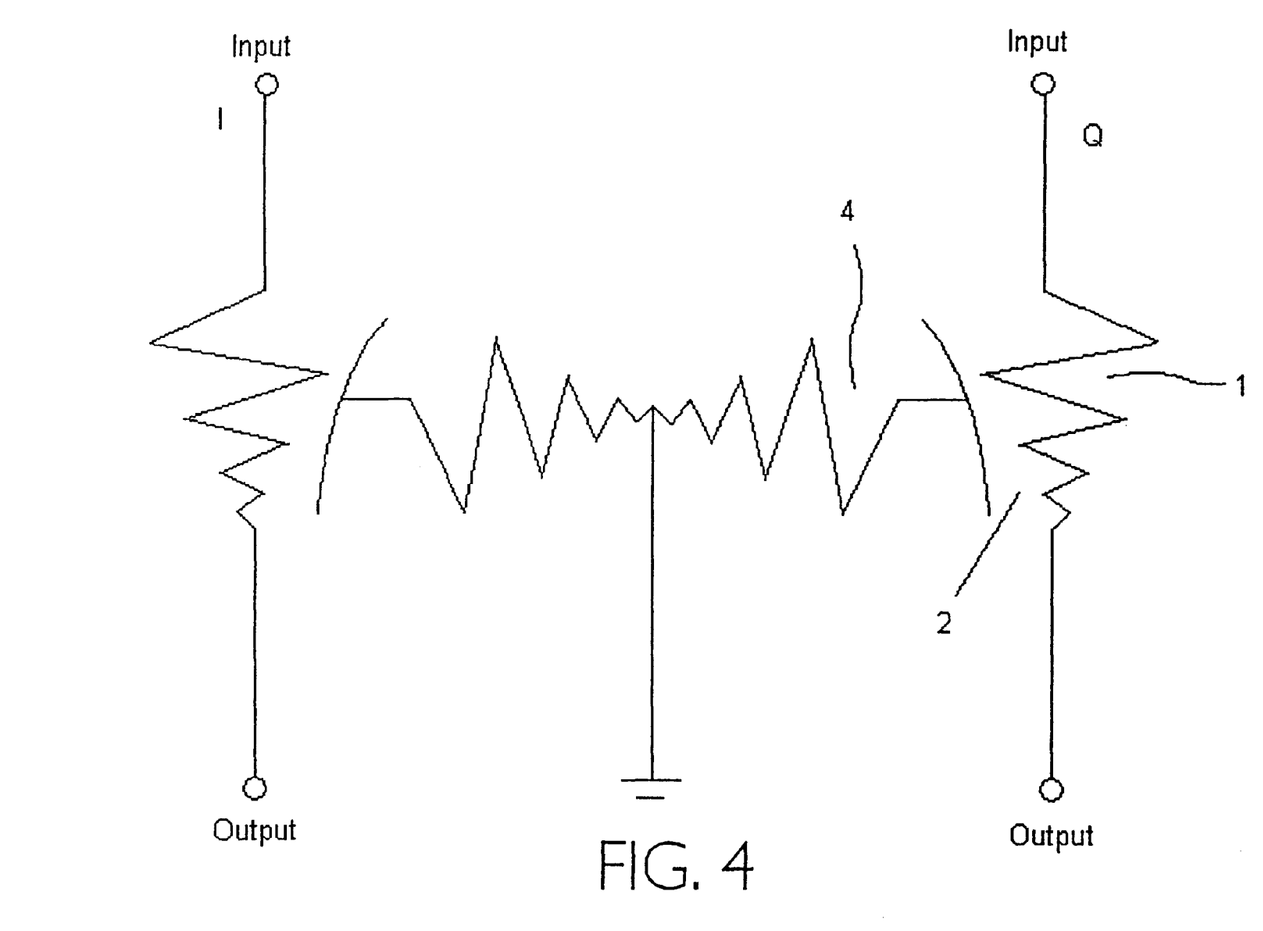
FIG. 4 shows the basic circuit of a thin-film component in accordance with a second embodiment, having two RC notch-filters with distributed notch resistance.
Figure 5:
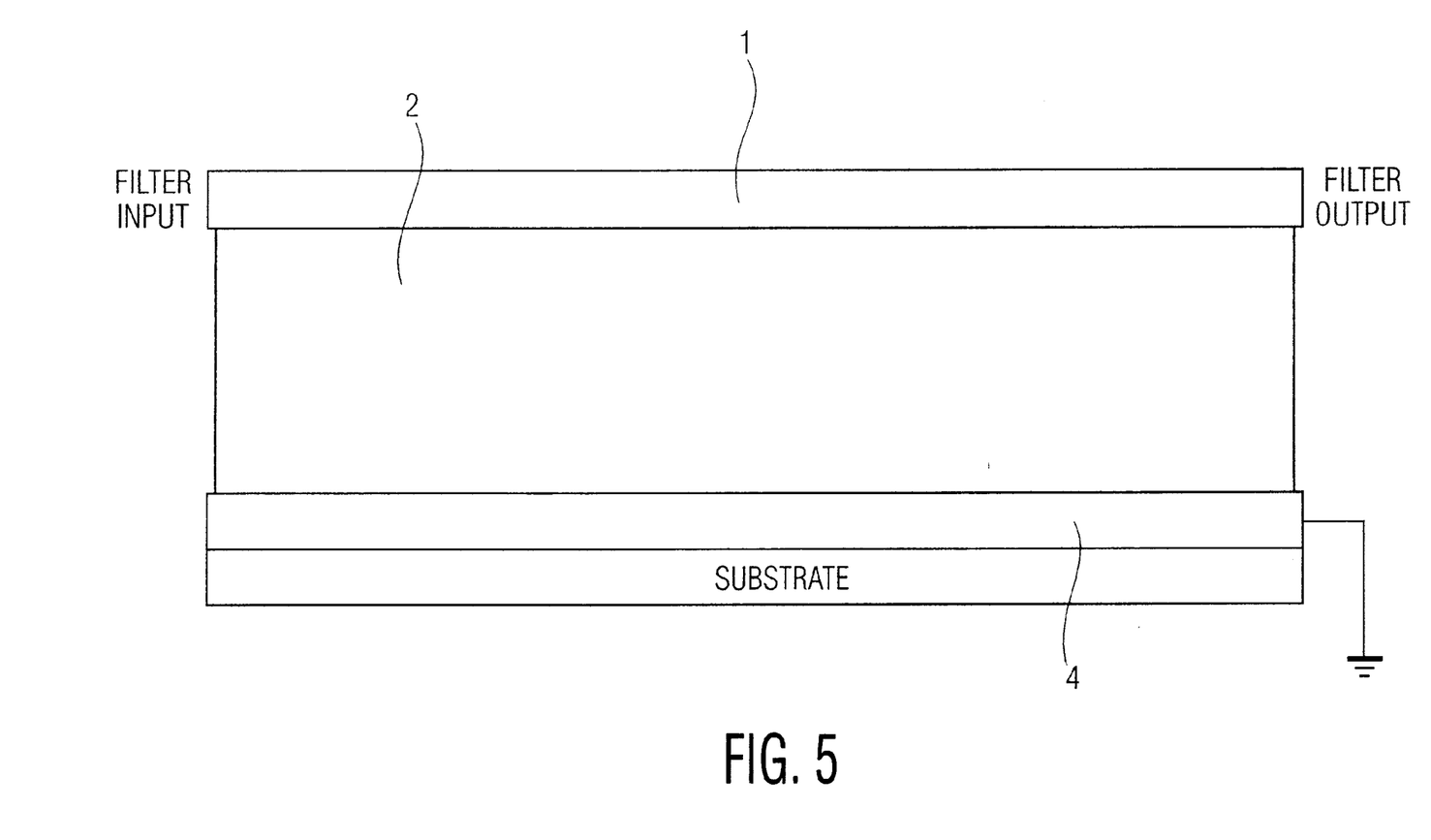
FIG. 5 is a cross-sectional view of a thin-film component in accordance with FIG. 4.
Figure 6:
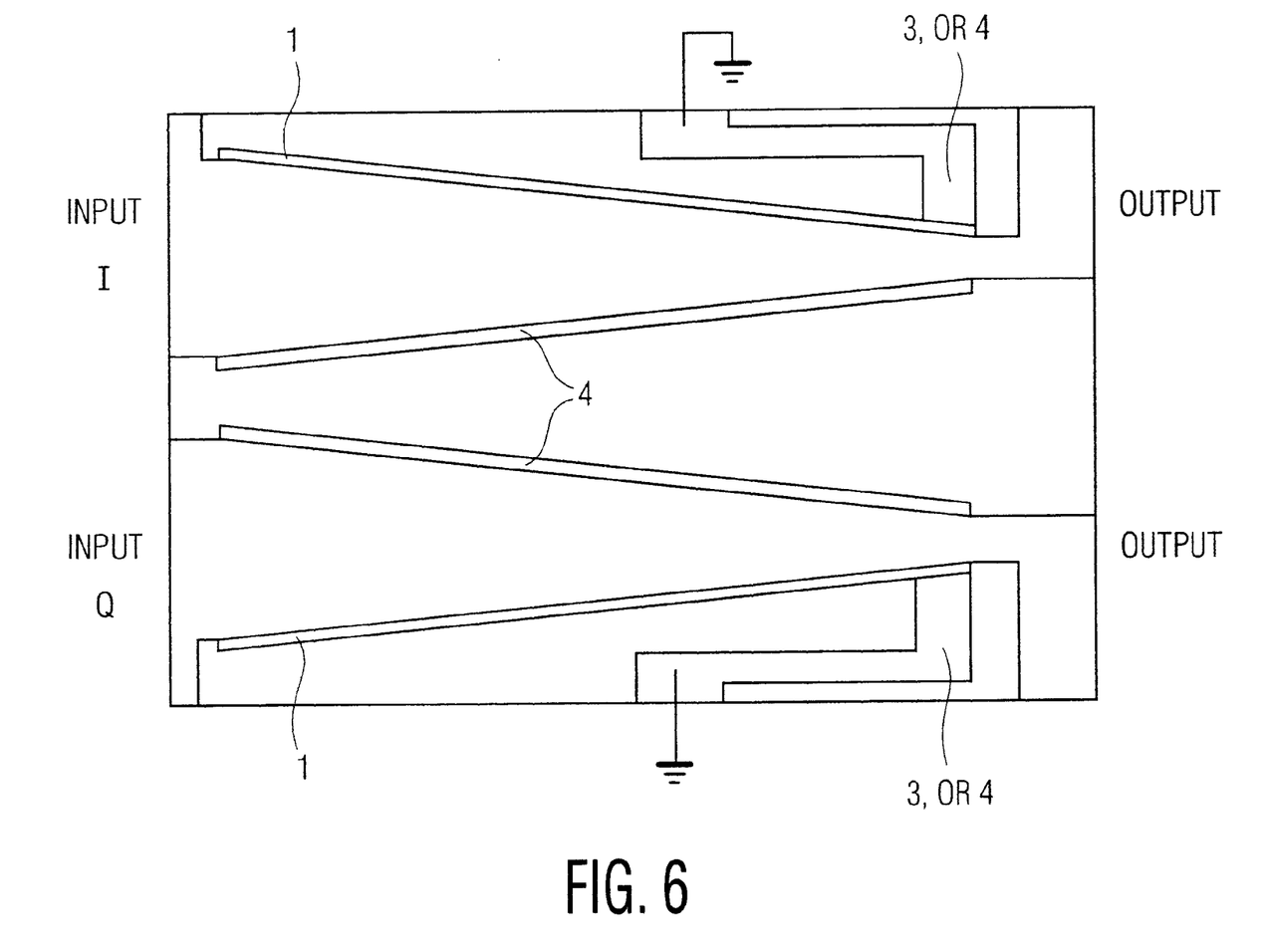
FIG. 6 is a plan view of a thin-film component in accordance with FIG. 4.

This embodiment relates to a thin-film component comprising two distributed RC notch-filters with a distributed notch resistor on an $Al_2O_3$ substrate having a size of 1210 (3.0 mm×2.4 mm) in accordance with the basic circuit shown in FIG. 4. The construction of the thin-film component is shown in FIG. 5 and FIG. 6. A dielectric layer 2 of 1.1 μm thick $Si_3Ni_4$ as the capacitor with 55 pF/mm$^2$ is deposited on a lower electrode 3 of a NiCrAl resistance layer having a surface resistance of 8.5 Ω/□. A resistance layer of NiCrAl as the upper electrode 1 having a surface resistance of 100 Ω/□ is provided thereon. The lower electrode 3 itself constitutes a distributed notch resistor 4 and is electrically connected to ground during operation of the filter.

In accordance with another embodiment, the lower electrode 3 and the upper electrode 1 may be exchanged. In this case, the upper electrode 3 forms the distributed notch resistor 4 and is electrically connected to ground during operation of the filter.

The thin-film component is protected against moisture by means of a protective layer of $Si_3Ni_4$ or polyimide, and provided with standard SMD end-contacts of Cu/Ni/Sn.

Figure 7:
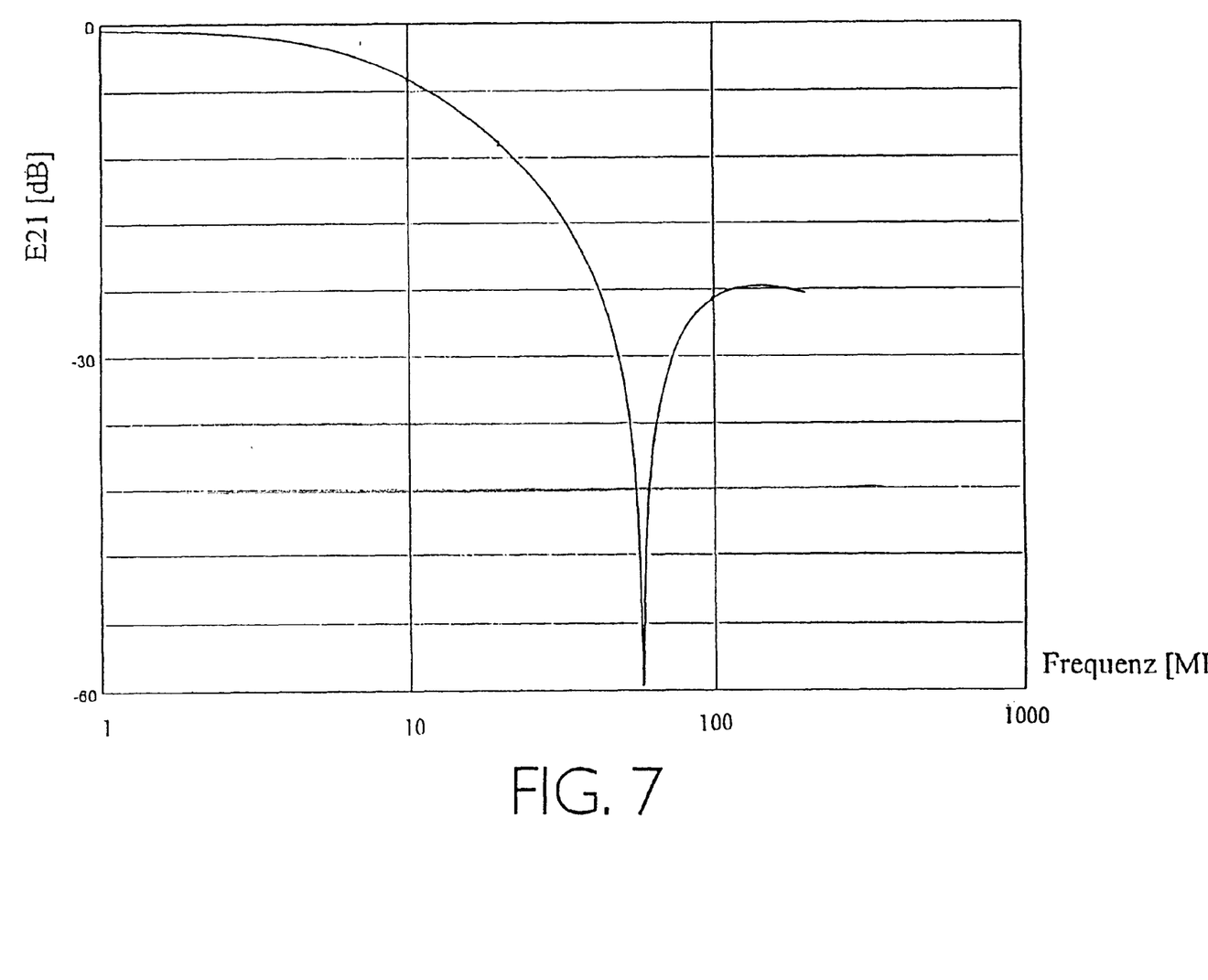
FIG. 7 shows the transmission behavior of a thin-film component in accordance with FIG. 4.

The basic transmission ratio between input voltage and output voltage (Ua/Ue) of such a thin-film component with two RC filters is shown in dependence upon the frequency in FIG. 7. The input was terminated with 50 Ω, the output with 10 kΩ.

EXAMPLE 3

This embodiment relates to a thin-film component comprising two RC notch-filters composed of discrete thin-film resistors and thin-film capacitors and integrated on a common substrate.

Figure 8:
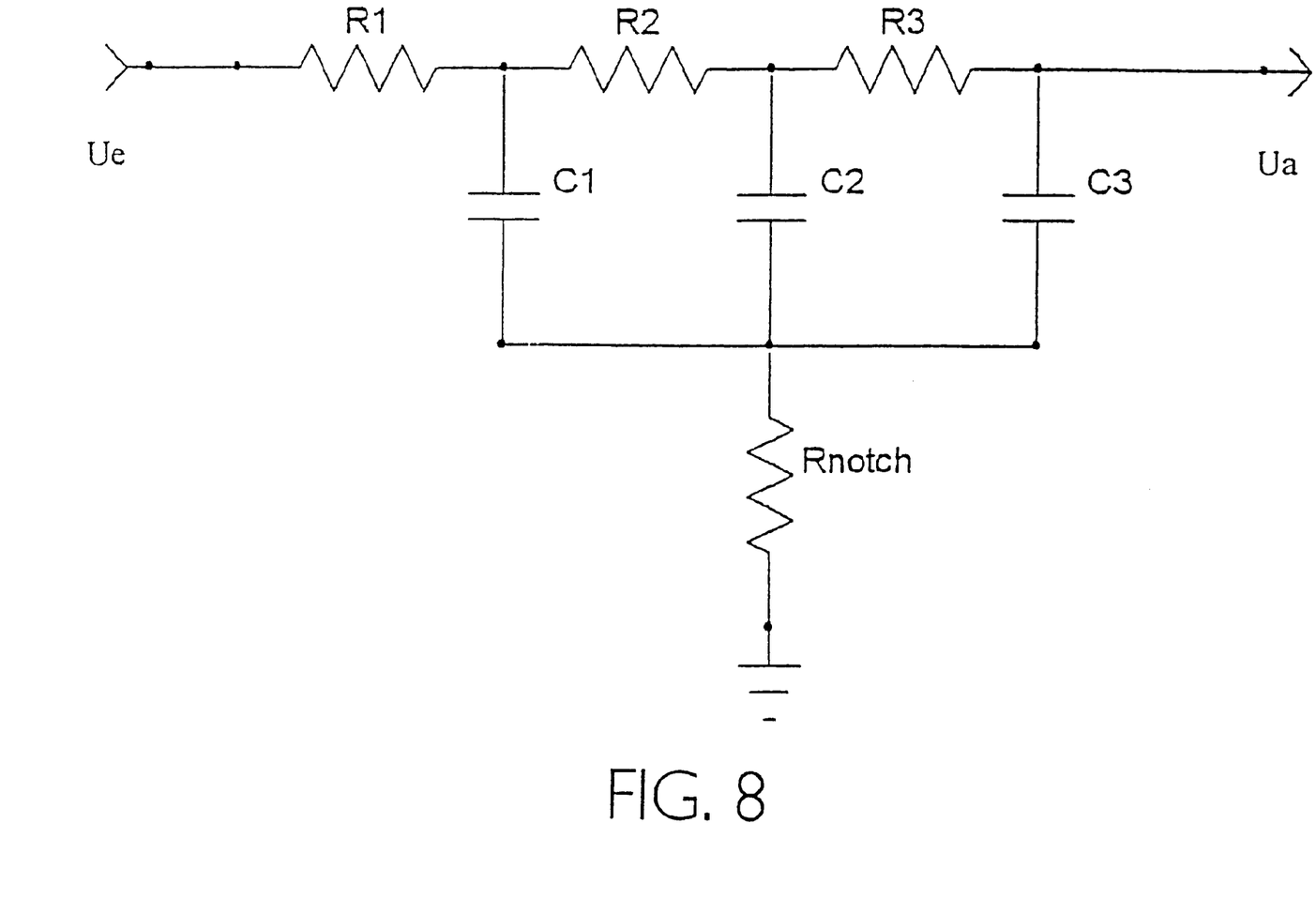
FIG. 8 shows the basic circuit of a thin-film component of a third embodiment, having two discrete RC filters.
Figure 9:
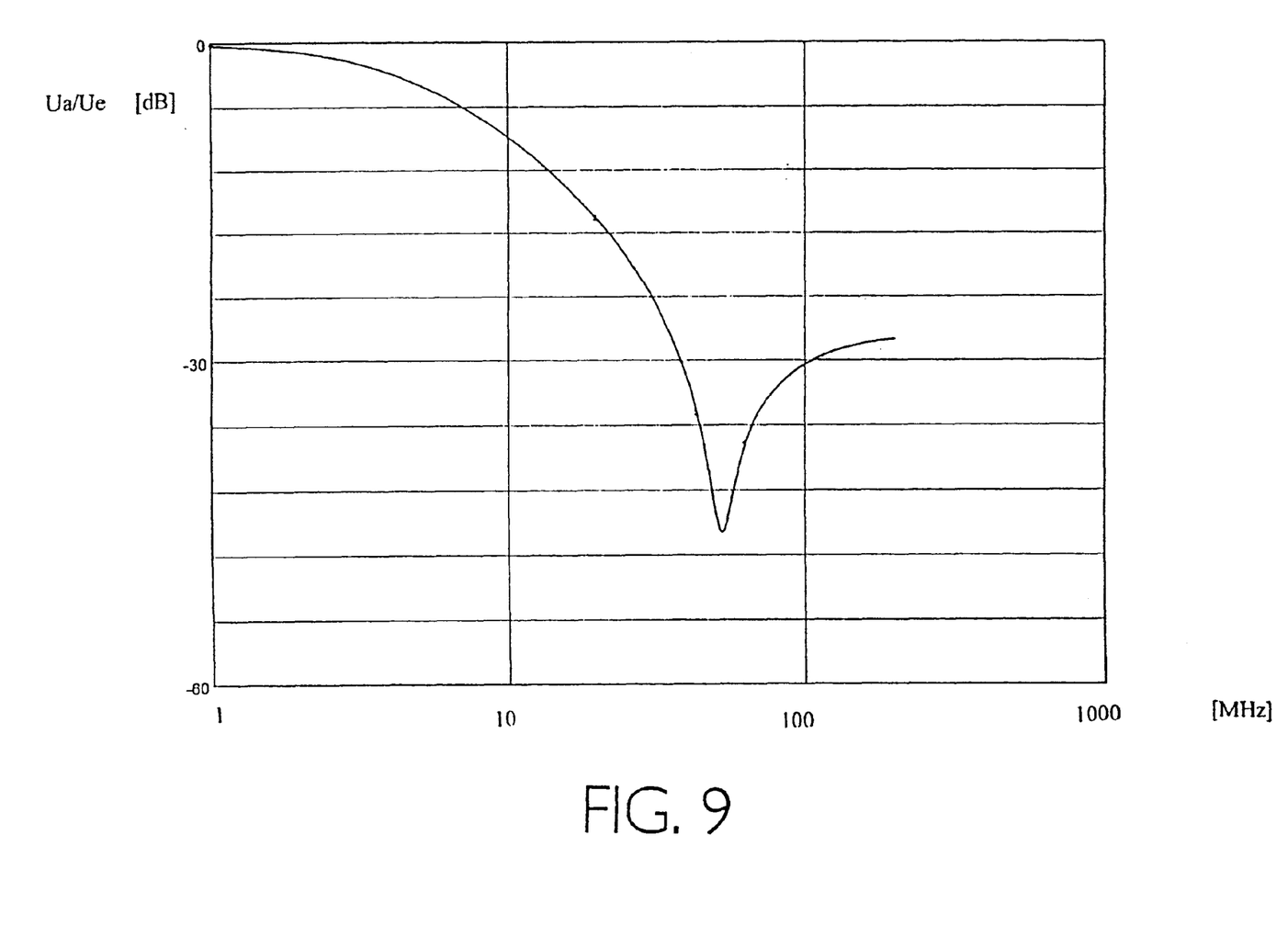
FIG. 9 shows the transmission behavior of a thin-film component in accordance with FIG. 8.

Each RC notch-filter is composed of three capacitors and four resistors, as shown in FIG. 8. Dependent upon the desired filter curve, it is also possible to use more or fewer capacitors and resistors. The basic transmission ratio between input voltage and output voltage (Ua/Ue) of such a thin-film component comprising two RC filters with $R1=300$ Ω, $R2=402$ Ω, $R3=249$ Ω, $R_{notch}=13$ Ω, $C1=39$ pF, $C2=39$ pF and $C3=3$ pF is shown in dependence upon the frequency in FIG. 9. The input was terminated with 50 Ω, the output with 10 kΩ.

What is claimed is:

1. A zero-IF-converter comprising a thin-film component including at least two RC filters each comprising a resistor and a capacitor which each include a lower electrode, an upper electrode and a dielectric material, characterized in that the RC filters are arranged on a common substrate, further characterized in that base signals of the two RC filters have a constant amplitude and phase relationship, and wherein the lower electrode further comprises a distributed notch resistor.

2. A zero-IF-converter as claimed in claim 1, characterized in that at least one RC filter is a distributed RC filter.

3. A zero-IF-converter as claimed in claim 2, characterized in that the lower electrode of the distributed RC filter is resistive.

4. A zero-IF-converter as claimed in claim 2, characterized in that the upper electrode of the distributed RC filter is resistive.

5. A zero-IF-converter as claimed in claim 1, characterized in that the substrate is made of a heat-conducting material.

6. A zero-IF-converter as claimed in claim 1, characterized in that at least one RC filter is a RC notch- filter having a notch resistor.

7. A thin-film component comprising at least two RC filters each including a resistor and a capacitor which each comprise a lower electrode, an upper electrode and a dielectric material, characterized in that said RC filters are arranged on a common substrate, further characterized in that base signals of the two RC filters have a constant amplitude and phase relationship, and wherein the lower electrode further comprises a distributed notch resistor.

* * * * *